United States Patent [19]
Ezell et al.

[11] Patent Number: 6,081,154
[45] Date of Patent: Jun. 27, 2000

[54] CIRCUIT FOR DETERMINING THE REMAINING OPERATING LIFE OF A SYSTEM

[75] Inventors: Richard William Ezell; James M. Douglass, both of Carrollton, Tex.

[73] Assignee: Dallas Semiconductor, Dallas, Tex.

[21] Appl. No.: 09/045,268

[22] Filed: Mar. 20, 1998

[51] Int. Cl.$^7$ .................................................. G05F 1/10
[52] U.S. Cl. ........................... 327/540; 307/48; 324/426; 324/434
[58] Field of Search ..................................... 327/538, 540; 307/48, 66, 19; 324/427, 434, 426, 431

[56] References Cited

U.S. PATENT DOCUMENTS

| | | | |
|---|---|---|---|
| 5,280,231 | 1/1994 | Kato et al. | 320/31 |
| 5,284,719 | 2/1994 | Landau et al. | 429/50 |
| 5,357,203 | 10/1994 | Landau et al. | 324/427 |
| 5,432,429 | 7/1995 | Armstrong, II et al. | 320/43 |
| 5,513,235 | 4/1996 | Douglass et al. | 377/25 |
| 5,529,069 | 6/1996 | Dias et al. | 320/30 |
| 5,621,302 | 4/1997 | Shinohara | 320/22 |
| 5,627,449 | 5/1997 | Fujiki | 320/5 |
| 5,629,600 | 5/1997 | Hara | 320/5 |
| 5,933,049 | 8/1999 | Melse | 327/540 |

OTHER PUBLICATIONS

"DS 2437 Smart Battery Monitor" Data Sheet; *Dallas Semiconductor Corporation*; 32 pages, Jul. 8, 1999.
"bq2010 Gas Gauge IC" Data Sheet; *Benchmarq*; Apr. 1995; 20 pages.
"bq2011 Gas Gauge IC For High Discharge Rates" Data Sheet; *Benchmarq*; Feb. 1996; 20 pages.
"bq2012 Gas Gauge IC With Slow–Charge Control" Data Sheet; *Benchmarq*; Sep. 1996; 20 pages.
"bq2013H Gas Gauge IC For Power–Assist Applications" Data Sheet; *Benchmarq*; May 1999; 24 pages.
"bq2014 Gas Gauge IC With External Charge Control" Data Sheet; *Benchmarq*; Dec. 1995; 20 pages.
"bq2018 Power Minder™ IC" Data Sheet; *Benchmarq*; Jun. 1999; 20 pages.
"bq2040 Gas Gauge IC With SMBus Interface" Data Sheet; *Benchmarq*; Jun. 1999; 32 pages.
"bq2050 Lithium Ion Power Gauge™ IC" Data Sheet; *Benchmarq*; Sep. 1996; 20 pages.
"bq2092 Gas Gauge IC With SMBus–Like Interface" Data Sheet; *Benchmarq*; Jun. 1999; 28 pages.
"bq2945 Gas Gauge IC with SMBus Interface" Data Sheet; *Benchmarq*; Jun. 1999; 32 pages.

*Primary Examiner*—Jung Kim
*Attorney, Agent, or Firm*—Jenkens & Gilchrist, a Professional Corporation

[57] ABSTRACT

Gas gauge circuitry for monitoring and accumulating various operating parameters of a rechargeable battery with selected parameters being used to determine the remaining operating life of a rechargeable battery, and includes a current monitor for measuring the current flow into and out of the rechargeable battery. An integrated current accumulator is connected to the current monitor and is used to maintain a net accumulated total of current flowing into and out of the rechargeable battery. A charging current accumulator, which is also coupled to the current meter is used to maintain the total current flowing into the rechargeable battery, while a discharging current accumulator is used to maintain the total current flowing out of the rechargeable battery. A highly accurate, oscillatory circuit is used to drive the accumulators to increase the accuracy of the gas gauge functions therefrom.

26 Claims, 2 Drawing Sheets

CIRCUIT FOR DETERMINING THE REMAINING OPERATING LIFE OF A SYSTEM

FIELD OF THE INVENTION

This invention relates to battery packs, and more particularly, but not by way of limitation, to circuitry for monitoring and accumulating various operating parameters of a battery cell within the rechargeable battery pack, whereby these parameters can be used to accurately determine the remaining operating life of the rechargeable battery pack.

BACKGROUND OF THE INVENTION

Many portable electronic systems, such as laptop computers and cellular phones, utilize rechargeable battery packs to receive their power. Such battery packs have the advantage that they are portable, relatively weight efficient, and can be charged and discharged many times. However, due to certain characteristics of existing rechargeable battery packs, an accurate indication of the remaining charge is very difficult to determine.

As can be appreciated, it is very desirable to be able to accurately determine the remaining operating life of a rechargeable battery pack used in a system such as a laptop computer. This enables a user to get maximum use out of the rechargeable battery pack. This is especially critical when the remaining energy of the rechargeable battery pack falls below the operating threshold of the computer. A user would ideally want to be able to safely shut down the computer prior thereto, thereby preventing any potential loss of information.

The amount of the charge flowing into and out of the rechargeable battery pack during charging and discharging are parameters that can be monitored and used to calculate the remaining charge of a rechargeable battery. As can be further appreciated, the more accurately and reliably this information is measured and accumulated, the more accurate the calculation of the remaining charge of the rechargeable battery.

In addition to the discharge that occurs during regular use of a rechargeable battery pack, a rechargeable battery pack will also have a certain amount of self-discharge when not in use. This self-discharge is very difficult to account for when calculating the remaining charge of the rechargeable battery. In existing rechargeable battery packs, the amount of time the rechargeable battery pack is not being used is very difficult to determine. Additionally, the amount of self-discharge of a rechargeable battery will fluctuate with varying temperatures. As can be appreciated, a problem with existing rechargeable battery packs is that they do not take into account the self-discharge of the battery, nor do they take into account the varying temperatures when calculating the remaining charge of the rechargeable battery.

Therefore, there is a need for accurate and reliable gas gauge circuitry to determine the remaining operating life of a rechargeable battery.

SUMMARY OF THE INVENTION

The present invention overcomes the above identified problems as well as other shortcomings and deficiencies of existing technologies by providing oscillator driven gas gauge circuitry used to accurately determine the remaining operating life of a system such as rechargeable battery.

The present invention further provides low powered electronic circuitry for monitoring and accumulating various operating parameters of a rechargeable battery, whereby select parameters are used to determine the remaining operating life of a rechargeable battery. The circuitry includes a current monitor used to measure the current flow into and out of the rechargeable battery. An integrated current accumulator connected to the current monitor is used to maintain a net accumulated total of current flowing into and out of the rechargeable battery. A charging current accumulator, which is also coupled to the current meter is used to maintain the total current flowing into the rechargeable battery, while a discharging current accumulator is used to maintain the total current flowing out of the rechargeable battery. A highly accurate oscillator clock is used to drive the accumulators to greatly increase the accuracy of the gas gauge functions therefrom.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION

Figure 1:
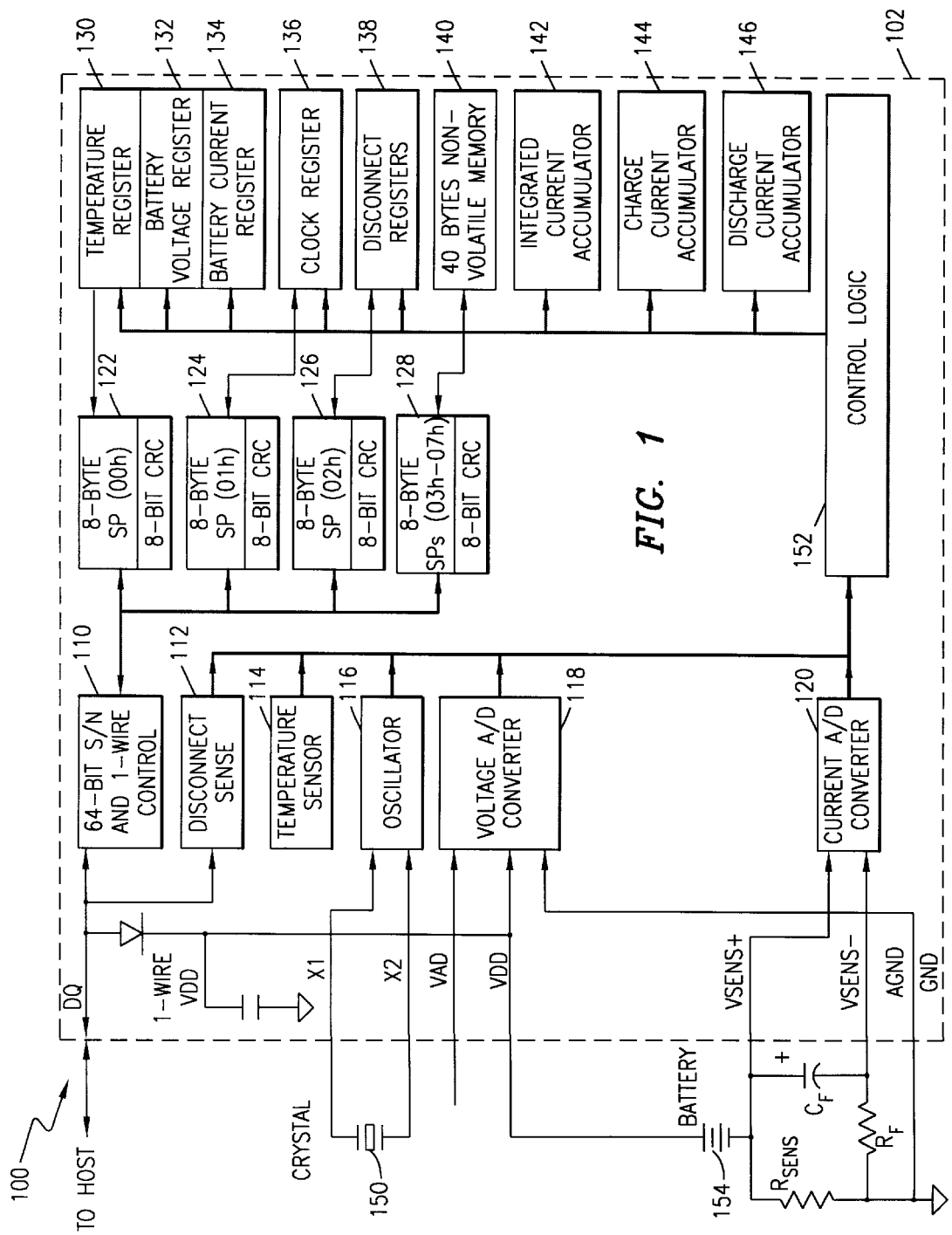
FIG. 1 is a diagram illustrating a rechargeable battery utilizing the present invention.

With reference now to FIG. 1, there is illustrated a schematic diagram illustrating an exemplary embodiment of a system 100 utilizing the present invention. In this exemplary embodiment system 100 is a rechargeable battery pack and includes gas gauge or battery monitoring circuitry 102 with some peripheral circuitry connected thereto.

The Dallas Semiconductor DS2437 Smart Battery Monitor illustrates an exemplary embodiment of an electronic device utilizing battery monitoring circuitry 102, the data sheet of which is incorporated herein by reference.

As depicted in FIG. 1, battery monitoring circuitry 102 includes a 64-Bit serial number and one-wire control circuitry 110; disconnect sense circuitry 112; temperature sensor 114; an oscillator, e.g. oscillatory circuitry 116; a voltage analog-to-digital converter 118; a current analog-to-digital converter 120; scratch-pad memories 122, 124, 126 and 128, each having an 8-bit CRC; a temperature register 130; battery voltage register 132; battery current register 134; clock register 136; disconnect registers 138; non-volatile memory 140; an integrated current accumulator 142; a charge current accumulator 144; a discharge current accumulator 146; and control logical circuitry 152.

As further depicted in FIG. 1, some of the peripheral circuitry connected to battery monitoring circuitry 102 includes a crystal 150, and rechargeable battery cells or rechargeable batteries 154.

The use of the 64-bit serial number and single-wire control 110 allows the tagging of rechargeable battery pack 100 with a unique serial number such that multiple battery pack monitors could exist and be utilized on the same single-wire data bus, i.e. several battery packs could be charged/monitored by the same host system. Additionally, in an exemplary embodiment, temperature sensor 114 eliminates the need for thermistors in the battery pack through the utilization of a direct-to-digital temperature sensor. Voltage analog-to-digital converter 118 and current analog-to-digital converter 120 measure the rechargeable battery's voltage and current, respectively. Analog-to-digital converters 118 and 120 permit the monitoring of battery cells 154 to determine the end-of-charge and the end-of-discharge thereof. Integrated current accumulator 142 keeps track of the remaining capacity of battery cells 154, while the charging current accumulator 144 keeps a running total of all charge having flowed into battery cells 154, and the discharging current accumulator 146 keeps a running total of all charge having flowed out of battery cells 154. The current measurements of the current analog-to-digital converter 120 and the values stored in 142, 144 and 146 current accumulators can be utilized to calculate the capacity remaining in battery cells 154. The data generated by oscillator 116, i.e. clock data, is stored in clock register 136, and can be used to calculate battery self-discharge or time-related charge termination limits.

Battery monitoring circuitry 102 can receive power over a one-wire data bus connected to input pin DQ, which is connected to the one-wire control circuit 110. Battery monitoring circuitry 102 "steals" power whenever the signal at the DQ I/O is high; this is known as "parasite" power. The advantage of parasite power is that serial numbers stored in memory can be read in the absence of normal power, such as when the battery cells 154 are completely discharged.

Still referring to FIG. 1, temperature sensor 114 is used to measure the temperature of rechargeable battery pack 100, with the data corresponding to the sensed temperature of the rechargeable battery pack 100 being stored in temperature register 130. Generally a temperature reading is taken at selected intervals, determined by oscillator 116, wherein the data corresponding to the sensed temperature is passed to temperature register 130 by control logic circuitry 152. The data can then be accessed by a user through DQ input/output over a one-wire data bus controlled by one-wire control circuitry 110. In one exemplary embodiment, good results have been achieved by using a temperature sensor wherein the data corresponding to the sensed temperature is converted by the temperature sensor from analog to digital, such that the temperature data can be transmitted digitally, directly from the battery monitor over the one-wire data bus by one-wire control 110.

Although the exemplary embodiment of the present invention as described herein is depicted as utilizing one-wire data bus technology, it is contemplated that the present invention is not necessarily limited to this technology, but rather can be practiced with virtually any type of data bus technology, such as, but not by way of limitation, two wire data bus architecture and three wire data bus architecture.

Still referring to FIG. 1, voltage analog-to-digital converter 118 is coupled to battery cells 154 through the VDD port. Voltage analog-to-digital converter 118 measures and determines the voltage of battery cells 154. Voltage analog-to-digital converter 118 performs an analog-to-digital conversion when instructed to do so by a command received from the host via the DQ input/output. The result of the voltage measurement is placed in battery voltage register 132, which is a two-byte register. This information is accessible by external devices through DQ I/O interface.

Still referring to FIG. 1, battery monitoring circuitry 102 includes current analog-to-digital converter 120 which is used to monitor current flow into and out of the battery cells 154. In one exemplary embodiment, current analog-to-digital converter 120 includes a sigma-delta analog-to-digital converter that measures the current flow into and out of battery cells 154. This is performed at a rate of 32 measurements/sec as clocked by oscillator circuit 116 with no user command required to initiate the current flow measurements. Current is measured into and out of battery cells 154 through the VSENS pins, with the voltage from the VSENS+ pin to the VSENS− pin equal to the voltage across capacitor $C_F$. Good results have been achieved by connecting current analog-to-digital converter 120 to a filter (resistor, $R_F$ and capacitor, $C_F$) which serves to average the voltage across $R_{SENS}$ (which reflects the current into or out battery cells 154). This filter is configured to capture the effect of current spikes that may occur during operation. By averaging current spikes, current accumulators 142, 144 and 146 can more accurately reflect the total charge which has gone into and out of the battery. In one exemplary embodiment, the current is presented as a 9-bit signed number with 10-bit resolution, with the last completed measurement written to battery current register 134.

Still referring to FIG. 1, there are three current accumulators, an integrated current accumulator (ICA) 142, a charging current accumulator (CCA) 144, and a discharging current accumulator (DCA) 146, with each accumulator being driven by oscillator 116. Each accumulator further includes a register associated therewith. ICA 142 maintains a net accumulated total of current flowing into and out of battery cells 154, whereby a reading taken from the register of ICA 142 gives an indication of the remaining capacity of battery cells 154, and can be used in performing gas gauge functions.

CCA 144 is used to accumulate battery charging (positive) current, while DCA 146 is used to accumulate discharging (negative) current. The information generated by CCA 144 and DCA 146 is used to determine the end of battery life of the battery cells 154, based on the total charge/discharge current over the lifetime of the battery cells 154. The current measured by current analog-to-digital converter 120 yields a result which is the average of the current measured over the select time interval clocked by oscillator 116 (such as every 31.25 ms). This measured current is then used to increment or decrement the register of ICA 142, increment the register of CCA 144 (if current is positive), and increment the register of DCA 146 (if the current is negative).

In an exemplary embodiment, ICA 142 is a 0.01C resolution, 8-bit volatile binary counter driven by oscillator 116 and represents the amount of capacity remaining in battery cells 154. The amount of capacity remaining in battery cells 154 is measured in terms of the full capacity (IC) of the battery cells normalized to a count of $100_{10}$. Thus, an ICA count of $100_{10}$ represents IC of charge, i.e. 100% capacity or fully charged. An ICA count of 0 represents 0% capacity, i.e. fully discharged. In this exemplary embodiment, ICA 142 will count up to $255_{10}$ (2.55C), since charging of battery cells 154 typically provides to the battery cell more than its capacity. When this occurs, ICA 142 can be reset to a count of $100_{10}$ when charging is complete, to indicate that the battery cells are at 100% of capacity, and to further ensure that later gas gauge measurements are accurate.

Still referring to FIG. 1, in this exemplary embodiment of system 100, CCA 144 is a two-byte, 0.32C resolution, non-volatile read/write counter which represents the total charging current battery cells 154 have encountered in their lifetime. CCA 144 is only updated when current through $R_{SENS}$ is positive and battery cells 154 are being charged. The non-volatility of the register of CCA 144 will allow this information to accumulate over the lifetime of battery cells 154 and will not be lost when battery cells 154 become discharged.

DCA 146 is a two-byte, 0.32C resolution, non-volatile counter which represents the total discharging current battery cells 154 have encountered over their lifetime. DCA 146 is only updated when current through $R_{SENS}$ is negative and battery cells 154 are being discharged. As with the register of CCA 144, the non-volatility of the register of DCA 146 allows this information to accumulate over the lifetime of battery cells 154 and will not be lost when battery cells 154 become discharged. In normal operation, when battery cells 154 become fully discharged, the value of the register of ICA 142 reaches 0, while the values of the registers of CCA 144 and DCA 146 are maintained.

Continuing to refer to FIG. 1, oscillator circuit 116 and crystal 150 together form a highly accurate clock used to generate a timing signal which is used for the timebase of the timekeeping functions. In operation, oscillator circuit 116 is driven by crystal 150 and operates as a clock with a four-byte binary counter with a 1-second resolution. The four bytes are a count of seconds. The timekeeping functions are double buffered, allowing a user to read time without the data changing while it is being read. This is accomplished by taking a "snapshot" of the counter data and transferring it to clock register 136, which the user accesses.

As described herein above, the three current accumulators operate at select time intervals as clocked by the timing signal generated by oscillator circuit 116 and crystal 150. Another of the functions utilizing the timing signal generated by oscillator circuit 116 and crystal 150 is a disconnect timestamp. When disconnect sense circuitry 112 senses that the signal at DQ pin has been low for more than one full second, indicating that rechargeable battery pack 100 has been removed from a system, a disconnect timestamp representing disconnect time is written into the disconnect register 138. Upon replacement of battery pack 100 into the system, the determination of how long the battery has been in storage can be made, thereby facilitating self-discharge corrections to the remaining battery capacity.

Still another function utilizing the timing signal generated by oscillator circuit 116 is an end-of-charge timestamp. During the charging of battery cells 154, when current changes direction, as detected by current analog-to-digital converter 120, the charging of battery cells 154 is finished. When this occurs, an end-of-charge timestamp is written to a register. This timestamp further allows the user to calculate the amount of time battery pack 100 has been in a discharge or storage state, further facilitating self-discharge calculations.

The above described timestamps, among other things, are used to calculate the amount of self-discharge of battery cells 154, therefore, the accuracy of the timing signal is very important, as any inaccuracies in the timing will affect the calculation of the amount of self-discharge of battery cells 154.

Although good results have been achieved in the present invention utilizing oscillator circuit 116 and crystal 150 to generate the timing signal as described hereinabove, it is contemplated to be within the scope of this invention that other types of highly accurate, temperature stable signal generators could be used, such as, but not by way of limitation, the Dallas Semiconductor DS1075, and other on-chip accurate non-crystal oscillators, and laser trimmed, high accuracy oscillators. It is further contemplated that the timing signal generator could be from another source, such as a microprocessor's clock in the battery pack.

As further depicted in FIG. 1, battery monitoring circuitry 102 includes scratch pad memories 122–128. Scratchpad memories 122–128 help to insure data integrity during communication of data over the one-wire data bus. In operation, data is first written to the scratchpad memory, where it can be read back for verification. After the data has been verified, the data will be transferred to the appropriate page in memory. The process insures data integrity when modifying the contents of the registers. As illustrated, each scratchpad memory contains a cyclic redundancy check (CRC) byte, which is the CRC over all of the bytes in a currently selected scratchpad memory. The CRC is used to validate the communication.

Figure 2:
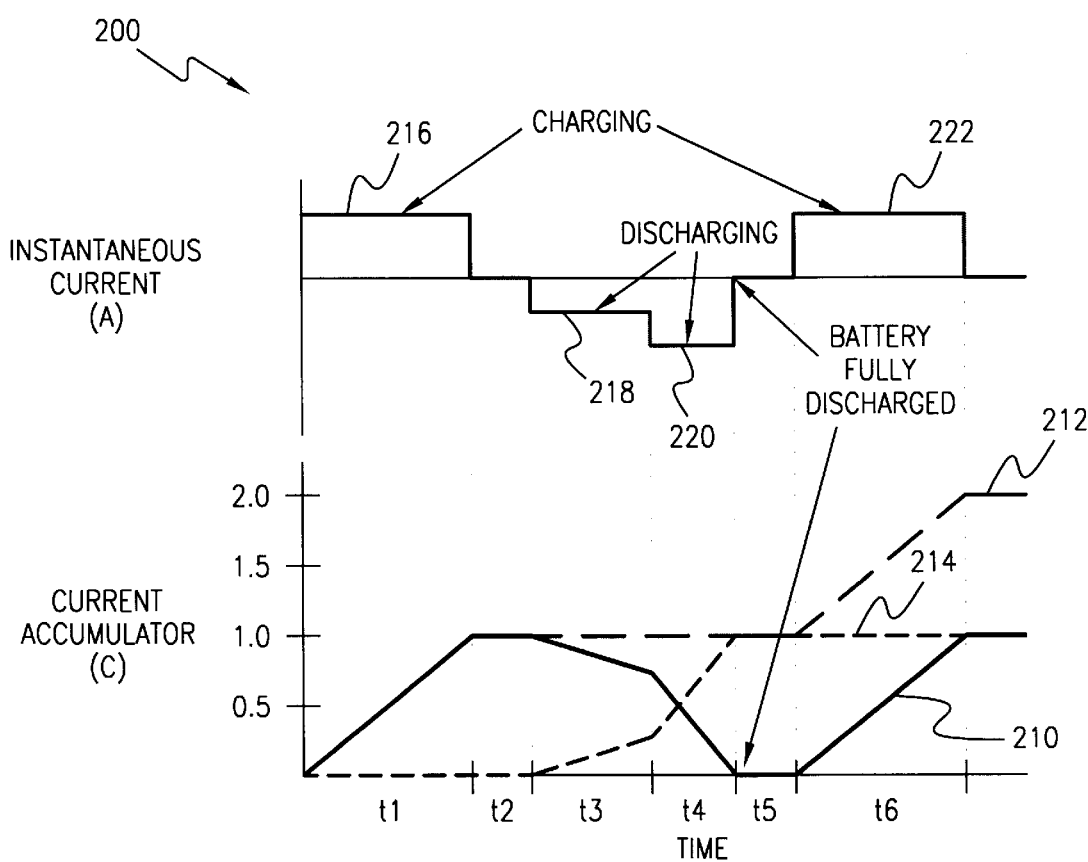
FIG. 2 is a graph illustrating the activity of the current accumulators of the present invention over a sample charge/discharge cycle.

Referring now to FIG. 2, there is illustrated a graph 200 representing the activity of ICA 142, CCA 144, and DCA 146 over a sample charge/discharge cycle of battery cells 154. As depicted, line 210 represents the activity of ICA 142, line 212 represents the activity of CCA 144, and line 214 represents the activity of DCA 146. During time period $t_1$, the first charging period 216, the values of ICA 142 and CCA 144 are increasing as the current flow into the rechargeable battery is positive while DCA 146 remains inactive. However, during time periods $t_3$ and $t_4$, discharge periods 218 and 220, the value of ICA 142 decreases and the value of DCA 146 increases as the current flows out of the rechargeable battery while the value of CCA 144 remains unchanged. During time period $t_6$, the second charging period 222, the values of ICA 142 and CCA 144 again increase, while the value of DCA 146 remains unchanged. As is evident from graph 200, when battery cells 154 become fully discharged and current stops flowing out of the battery cells 154, the values of CCA 144 and DCA 146 are maintained, while the value of ICA 142 will be at or near a count of zero.

As can be appreciated, the accuracy of the clock signal driving ICA, CCA and DCA is very important. Any error that occurs in the clock signal will be directly reflected in accumulators 142, 144 and 146 and thereby give a less accurate reading as to the remaining charge of battery cells 154.

Although the present invention is illustrated in a rechargeable battery system, it is contemplated that the present invention could also be utilized in non-battery applications, as well as non-electrical applications. For example, in a system where the life of the system is base upon the current flowing into the device, such as an electric motor, the present invention could be utilized to monitor the current flowing into the system and used to determine the remaining operating life thereof.

Those skilled in the art can realize that the teachings of the present invention as described hereinabove provides accurate oscillator driven gas gauge circuitry used to accurately determine the remaining operation expectancy of a rechargeable battery.

It can be further appreciated that the present invention provides electronic circuitry for monitoring and accumulating various operating parameters of a rechargeable battery with selected parameters being used to determine the remaining operating life of a rechargeable battery. The circuitry includes a current monitor for measuring the current flow into and out of the rechargeable battery. An integrated current accumulator, connected to the current monitor, is used to maintain a net accumulated total of current flowing into and out of the rechargeable battery. A charging current accumulator, which is also coupled to the current meter is used to maintain the total current flowing into the rechargeable battery, while a discharging current accumulator is used to maintain the total current flowing out of the rechargeable battery. An oscillator clock is used to drive each of the accumulators to assure high accuracy of the gas gauge calculations therefrom.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. Gas gauge circuitry for monitoring parameters associated with a rechargeable power source, said gas gauge circuitry comprising:
   monitoring circuitry coupled to the rechargeable power source, said monitoring circuitry for monitoring at least one parameter relating to the rechargeable power source; and
   a timekeeper coupled to said monitoring circuitry, said timekeeper for providing a timing signal to said monitoring circuitry;
   wherein said timekeeper generates an end-of-charge time stamp in response to completion of the charging of the rechargeable power source, said end-of-charge time stamp coding the time when the completion of the charging has occurred.

2. The gas gauge circuitry as recited in claim 1, wherein said monitoring circuitry includes a current monitor for measuring at least indications of discharging current from the rechargeable power source at select intervals timed by said timing signal.

3. The gas gauge circuitry as recited in claim 2, wherein said monitoring circuitry includes a first accumulator coupled to said current monitor, said first accumulator for accumulating values representing the total amount of charge having flowed out of the rechargeable power source.

4. The gas gauge circuitry as recited in claim 2, wherein said current monitor further measures at least indications of the charging current into the rechargeable power source.

5. The gas gauge circuitry as recited in claim 4, and further comprising a second accumulator coupled to said current monitor, said second accumulator for accumulating values representing the total amount of charge having flowed into the rechargeable power source.

6. The gas gauge circuitry as recited in claim 4, and further comprising a third accumulator coupled to said current monitor, said third accumulator for accumulating values representing the net amount of charge having flowed into and out of the rechargeable power source.

7. The gas gauge circuitry as recited in claim 1, wherein said monitoring circuitry includes a temperature monitor coupled to said timekeeper.

8. The gas gauge circuitry as recited in claim 1, wherein said timekeeper further generates a disconnect time stamp, said disconnect time stamp being used to determine the time at which said rechargeable power source is disconnected.

9. The gas gauge circuitry as recited in claim 8, wherein said disconnect timestamp is for calculating the amount of self-discharge of the rechargeable power source.

10. A device for monitoring at least one operating parameter of a system, the system including a rechargeable power source, the parameter used to calculate the remaining life expectancy of the system, said device comprising:
   a first accumulator for accumulating values associated with a selected one of the at least one operating parameters of the system; and
   a timing device coupled to said first accumulator, said timing device for generating a timing signal to time said first accumulator;
   wherein said timing device further generates a disconnect time stamp, said disconnect time stamp coding a disconnect time of said rechargeable power source from a device.

11. The device as recited in claim 10, wherein said timing device includes a crystal oscillator.

12. The device as recited in claim 10, further comprising a current meter coupled to said first accumulator wherein the selected one of the at least one operating parameters of the system includes current flowing into and out of the system such that said current meter measures the current flow into and out of the system.

13. The device as recited in claim 12, wherein said first accumulator accumulates the net total of current flowing into and out of the system.

14. The device as recited in claim 10, and further comprising a second accumulator for accumulating the total current flowing into the system.

15. The device as recited in claim 14, and further comprising a third accumulator for accumulating the total current flowing out of the system.

16. In a rechargeable battery system having a rechargeable battery with a current meter to measure the current flow into and out of the rechargeable battery, an electronic device for calculating the charge of the rechargeable battery, said electronic device comprising:
   a first current accumulator coupled to the current meter for receiving at least indications of the measured current flow into and out of the rechargeable battery, said first current accumulator for accumulating the net total of current flowing into and out of the rechargeable battery;
   a timing device coupled to said first accumulator, said timing device for generating a timing signal to time said first current accumulator, said timing device further for generating a time stamp; and
   a storage device for storing said generated time stamp wherein said time stamp coding a time at which an event within the battery system occurs.

17. The electronic device as recited in claim 16, and further comprising a second current accumulator coupled to the current meter for receiving at least indications of the measure current flow into the rechargeable battery, said second current accumulator for accumulating the total of current flowing into the rechargeable battery.

18. The electronic device as recited in claim 17, and further comprising a third current accumulator coupled to the current meter for receiving at least indications of the measure current flow out of the rechargeable battery, said third current accumulator for accumulating the total of current flowing out of the rechargeable battery.

19. The electronic device as recited in claim 18, wherein said timing device includes a crystal oscillator.

20. In a rechargeable battery system having a rechargeable battery with a current meter to measure the current flow into and out of the rechargeable battery, an electronic device for calculating the charge of the rechargeable battery, said electronic device comprising:
   a discharge current accumulator coupled to the current meter for receiving at least indications of the measured current flow out of the rechargeable battery, said discharge current accumulator for accumulating the total current flowing out of the rechargeable battery; and a timekeeping device coupled to said discharge accumulator, said timekeeping device for generating a timing signal to time said discharge current accumulator, said timekeeping device further generating a time stamp coding the time an event within the battery system occurs.

21. The electronic device as recited in claim 20, and further comprising an integrated current accumulator coupled to the current meter for receiving at least indications of the measure current flow into and out of the rechargeable battery, said integrated current accumulator for accumulating the net total of current flowing into and out of the rechargeable battery.

22. The electronic device as recited in claim 21, and further comprising a charge current accumulator coupled to the current meter for receiving at least indications of the measure current flow into the rechargeable battery, said charge current accumulator for accumulating the total of current flowing into the rechargeable battery.

23. The electronic device as recited in claim 22, wherein said timing device includes a crystal oscillator.

24. The electronic device as recited in claim 22, wherein said discharge current accumulator includes a two-byte non-volatile read/write counter.

25. The electronic device as recited in claim 22, wherein said integrated current accumulator includes an 8-bit volatile binary counter.

26. The electronic device as recited in claim 22, wherein said charge current accumulator includes a two-byte non-volatile read/write counter.

* * * * *